US006677680B2

(12) United States Patent
Gates et al.

(10) Patent No.: US 6,677,680 B2
(45) Date of Patent: Jan. 13, 2004

(54) HYBRID LOW-K INTERCONNECT STRUCTURE COMPRISED OF 2 SPIN-ON DIELECTRIC MATERIALS

(75) Inventors: Stephen McConnell Gates, Ossining, NY (US); Jeffrey Curtis Hedrick, Montvale, NJ (US); Satyanarayana V. Nitta, Poughquag, NY (US); Sampath Purushothaman, Yorktown Heights, NY (US); Cristy Sensenich Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,429

(22) Filed: Feb. 28, 2001

(65) Prior Publication Data

US 2002/0117754 A1 Aug. 29, 2002

(51) Int. Cl.$^7$ .............................................. H01L 23/48
(52) U.S. Cl. ........................ 257/758; 257/759; 257/760
(58) Field of Search ................................. 438/669, 705, 438/798; 257/752, 758, 759, 760

(56) References Cited

U.S. PATENT DOCUMENTS

| | | | | |
|---|---|---|---|---|
| 6,071,809 A | | 6/2000 | Zhao ........................... | 438/634 |
| 6,159,842 A | * | 12/2000 | Chang et al. ................. | 438/622 |
| 6,232,235 B1 | * | 5/2001 | Cave et al. .................. | 438/715 |
| 6,255,735 B1 | * | 7/2001 | Wang et al. .................. | 257/774 |
| 6,312,874 B1 | * | 11/2001 | Chan et al. .................. | 430/314 |

OTHER PUBLICATIONS

Goldblatt, R.D., et al., "A High Performance 0.13 $\mu$m Copper BEOL Technology with Low–k Dielectric", Proceedings of 2000 IITC, IEEE, (2000), (month not known).

Takao, Y., et al., "A 0.11 $\mu$m CMOS Technology with Copper and Very–low–k Interconnects for High–Performance System–On–a Chip Cores", IEEE, IEDM Tech. Digest, Dec. 2000, pp. 559–562.

Hasegawa, T., et al., "Copper Dual Damascene Interconnects with Low–K (Keff <3.0) Dielectrics Using FLARETM and an Organo–Silicate Hard Mask", IEEE, IEDM Tech. Digest, Dec. 1999, pp. 623–626.

* cited by examiner

Primary Examiner—T. N. Quach
(74) Attorney, Agent, or Firm—Scully, Scott, Murphy & Presser; Daniel P. Morris

(57) ABSTRACT

A metal wiring plus low-k dielectric interconnect structure of the dual damascene-type is provided wherein the conductive metal lines and vias are built into a hybrid low-k dielectric which includes two spun-on dielectrics that have different atomic compositions and at least one of the two spun-on dielectrics is porous. The two spun-on dielectrics used in forming the inventive hybrid low-k dielectric each have a dielectric constant of about 2.6 or less, preferably each dielectric of the hybrid structure has a k of from about 1.2 to about 2.2. By utilizing the inventive hybrid low-k dielectric excellent control over metal line resistance (trench depth) is obtained, without no added cost. This is achieved without the use of a buried etch stop layer, which if present, would be formed between the two spun-on dielectrics. Moreover, the spun-on dielectrics of the hybrid low-k dielectric have distinctly different atomic compositions enabling control over the conductor resistance using the bottom spun-on dielectric (i.e., via dielectric) as an inherent etch stop layer for the upper spun-on dielectric (i.e., line dielectric).

25 Claims, 3 Drawing Sheets

HYBRID LOW-K INTERCONNECT STRUCTURE COMPRISED OF 2 SPIN-ON DIELECTRIC MATERIALS

DESCRIPTION

1. Field of the Invention

The present invention relates to interconnect structures for high-speed microprocessors, application specific integrated circuits (ASICs) and other high-speed integrated circuits (ICs). The present invention provides low dielectric constant, i.e., low-k, interconnect structures having enhanced circuit speed, structure stability during thermal cycling, precise values of conductor resistance, reduced fabrication cost, and improved ease of processing due to chemical-mechanical polishing (CMP) compatibility. Moreover, the inventive structures have a lower effective dielectric constant and improved control over metal line resistance as compared to conventional structures of the prior art.

2. Background of the Invention

Many ultra-low-k (on the order of about 3.5 or less) plus Cu interconnect structures of the dual damascene-type are known; See, for example, R. D. Goldblatt, et al., "A High Performance 0.13 µm Copper BEOL Technology with Low-K Dielectric", Proceedings of the International Interconnect Technology Conference, IEEE Electron Devices Society, Jun. 5–7, 2000, pgs 261–263. Such prior art interconnect structures include inorganic as well as organic dielectric materials as the interlevel or intralevel dielectric. It is widely accepted that dual-damascene structures are lower cost than single damascene or subtractive metal structures.

Typically, there are four essential problems associated with prior art dual damascene interconnect structures which include the following:

(i) Poor control over Cu line thickness (i.e., trench depth) and resistivity.

(ii) High coefficient of thermal expansion (CTE) of low-k dielectrics, which may eventually lead to failure during thermal cycling.

(iii) The inability of the ultra-low-k dielectrics to survive chemical-mechanical polishing (CMP).

(iv) Increased cost to fabricate the structures.

During fabrication of prior art interconnect structures, the depth of the trenches that become the metal line conductors (after metal fill and CMP) is often poorly controlled, and the trench bottom has a rough surface. This effect is exacerbated when performing reactive-ion etching (RIE) on porous dielectrics. A timed reactive-ion etching (RIE) process is typically used to etch the trenches, with time controlling the trench depth. Variations in the etch rate with feature size (trench width) from day to day, and across the wafer, lead to large variations in the trench depth which, in turn, leads to large variations in the metal conductor resistance. Roughness at the trench bottom leads to higher capacitance, leaky electron current between metal lines, crosstalk, noise, power dissipation and ultimately, to poorer device performance and poorer reliability.

Common solutions to the aforementioned problems add extra processing steps, including deposition of a discrete etch stop layer in a separate plasma-enhanced chemical vapor deposition (PECVD) tool, thus raising the cost of fabricating the desired low-k plus Cu interconnect structure. Additionally, low-k dielectrics plus Cu interconnect structures of the dual damascene-type fail during thermal cycling tests due to a high-CTE of the dielectric surrounding the vias. Moreover, commonly used porous low-k dielectrics do not survive CMP. Instead, prior art porous low-k dielectrics tend to be delaminated and removed during the CMP process. Furthermore, prior art etch stop layers are made from vacuum-based PECVD deposition tools that are costly to purchase and maintain.

In view of the above problems in the prior art, there is a continued need for providing new and improved low-k dielectric interconnect structures of the dual damascene-type that overcome the drawbacks mentioned above.

SUMMARY OF THE INVENTION

One object of the present invention is to provide a low-k dielectric plus metal conductor interconnect structure of the dual damascene-type in which precise and uniform control over metal conductor resistance is obtained without thickness variation of the conductors.

Another object of the present invention is to provide a robust low-k dielectric plus metal conductor interconnect structure that is stable during thermal cycling due to a low-CTE of the dielectric surrounding the vias.

A further object of the present invention is to provide an interconnect structure that is easy to process because the structure survives CMP without delamination or other failures.

A yet further object of the present invention is to provide a low-k dielectric plus metal conductor interconnect structure which includes no additional processing steps thereby not significantly increasing the production cost of the structure.

An even further object of the present invention is to provide a low-k dielectric plus metal conductor interconnect structure which comprises a multilayer of spun-on dielectrics.

An additional object of the present invention is to provide a low-k dielectric plus metal conductor interconnect structure in which the process used in forming the same avoids the use of costly vacuum based deposition tools.

These and other objects and advantages are achieved in the present invention by providing a metal wiring plus low-k dielectric interconnect structure of the dual damascene-type wherein the conductive metal lines and vias are built into a hybrid low-k dielectric structure which includes two spun-on dielectrics that have different atomic compositions and at least one of the two spun-on dielectrics is porous. The two spun-on dielectrics used in forming the inventive hybrid low-k dielectric structure each have a dielectric constant of about 2.6 or less, preferably each dielectric of the hybrid structure has a k of from about 1.2 to about 2.2. By utilizing the inventive hybrid low-k dielectric structure excellent control over metal line resistance (trench depth) is obtained, without added cost. This is achieved without the use of a buried etch stop layer, which if present, would be formed between the two spun-on dielectrics.

In accordance with the present invention, the spun-on dielectrics of the hybrid low-k dielectric structure have distinctly different atomic compositions enabling control over the conductor resistance using the bottom spun-on dielectric (i.e., via dielectric) as an inherent etch stop layer for the upper spun-on dielectric (i.e., line dielectric).

In one aspect of the present invention, an interconnect structure is provided which comprises:

a substrate having a patterned hybrid low-k dielectric formed on a surface thereof, said patterned hybrid low-k dielectric having an effective dielectric constant of about 2.6 or less and comprising a bottom spun-on dielectric and a top spun-on dielectric, wherein said bottom and top spun-on dielectrics have different atomic compositions and at least one of said spun-on dielectrics is porous;

a polish stop layer formed on said patterned hybrid low-k dielectric; and metal conductor regions formed within said patterned hybrid low-k dielectric.

Another aspect of the present invention relates to a hybrid low-k dielectric which can be used in fabricating interconnect structures of the dual damascene-type. Specifically, the inventive hybrid dielectric comprises a bottom spun-on dielectric and a top spun-on dielectric, wherein said bottom and top spun-on dielectrics have dielectric constants of about 2.6 or less, different atomic compositions and at least one of said dielectrics is porous.

A further aspect of the present invention relates to a method of forming the aforementioned interconnect structure. Specifically, the method of the present invention comprises the steps of:

(a) forming a hybrid low-k dielectric on a surface of a substrate, said hybrid low-k dielectric having an effective dielectric constant of about 2.6 or less and comprising a bottom spun-on dielectric and a top spun-on dielectric, wherein said bottom and top spun-on dielectrics have different atomic compositions and at least one of said spun-on dielectrics is porous;

(b) forming a hard mask on said hybrid low-k dielectric, said hard mask including at least a polish stop layer;

(c) forming an opening in said hard mask so as to expose a portion of said hybrid low-k dielectric;

(d) forming a trench in said exposed portion of said hybrid low-k dielectric using said hard mask as an etch mask;

(e) filling said trench with at least a conductive metal; and (f) planarizing said conductive metal stopping on said polish stop layer.

DETAILED DESCRIPTION OF THE INVENTION

Figure 1A:
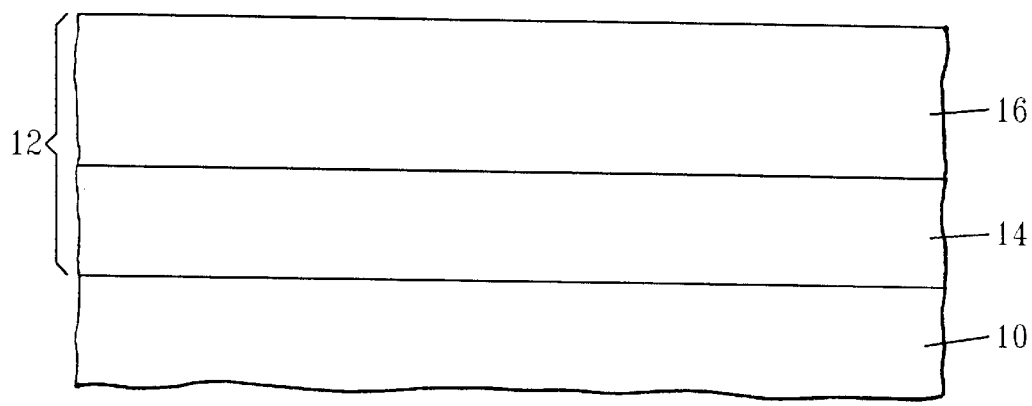
FIGS. 1A–1G are cross-sectional views of the inventive interconnect structure through various processing steps of the present invention.

The present invention which provides a hybrid dielectric that is useful in forming interconnect structures of the dual damascene-type will now be described in more detail by referring to the drawings that accompany the present invention. It is noted that like and/or corresponding elements of the drawings, are referred to by like reference numerals.

Reference is first made to FIG. 1A which illustrates an initial structure that is employed in the present invention. Specifically, the structure shown in FIG. 1A comprises substrate 10 having hybrid low-k dielectric 12 formed on a surface thereof. The hybrid low-k dielectric includes bottom spun-on dielectric 14 and top spun-on dielectric 16. In accordance with the present invention, the inventive hybrid dielectric has an effective dielectric constant of about 2.6 or less, with an effective dielectric constant of from about 1.2 to about 2.2 being more highly preferred.

The inventive hybrid low-k dielectric employed in the present invention includes two spun-on dielectrics that have different atomic compositions and at least one of the spun-on dielectrics is porous, preferably both spun-on dielectrics are porous. It is noted that the bottom spun-on dielectric serves as the via level dielectric of the interconnect structure, whereas the top spun-on dielectric serves as the line level dielectric of the interconnect structure. Moreover, since the effective dielectric constant of the hybrid dielectric is about 2.6 or less, the spun-on dielectrics are made from low-k (k of about 2.6 or less) dielectrics. A more detailed description concerning the hybrid low-k dielectric will be provided hereinbelow.

The substrate employed in the present invention may include any conventional material that is typically present in an interconnect structure. Thus, for example, substrate 10 may be a dielectric (interlevel or intralevel), a wiring level, an adhesion promoter, a semiconductor wafer or any combinations thereof. When a semiconductor wafer is employed as the substrate, the wafer may include various circuits and/or devices formed thereon.

As indicated above, each layer of the hybrid dielectric is formed utilizing conventional spin-on coating processing steps that are well known to those skilled in the art, and following the spin-on process each layer is subjected to a hot plate bake process which is carried out using conditions that are sufficient to remove any residual solvent from the spun-on dielectric layer and/or partially crosslink the layer so as to render the dielectric layer insoluble.

In one embodiment of the present invention, the bottom spun-on dielectric of the hybrid structure is an organic low-k dielectric which comprises C, O and H. Examples of organic low-k dielectrics that can be employed in the present invention include, but are not limited to: aromatic thermosetting polymeric resins, for example, resins sold by Dow Chemical Company under the tradename SiLK®, Honeywell under the tradename Flare®, and similar resins from other suppliers and other like organic dielectrics. It is noted that the organic dielectric employed in the present invention may, or may not be porous. When porous low-k organic dielectrics are employed, the pore size of the porous organic dielectrics may vary, but typically organic dielectrics having a pore size of from about 1 to about 50 nm at a volume percent pore size of from about 5 to about 35% are employed.

When the bottom spun-on dielectric is composed of an organic dielectric, then the top spun-on dielectric is formed of an inorganic dielectric layer. Typically, in the present invention, the inorganic dielectric layer comprises Si, O and H, and optionally C. An example of one type of inorganic dielectric that can be employed in the present invention is the silsesquioxane HOSP (Si-containing inorganic sold by Honeywell). Other types of inorganic dielectrics that may be employed in the present invention include, but are not limited to: methylsilsesquioxane (MSQ), tetraethylorthosilane (TEOS), hydrido silsesquioxane (HSQ), MSQ-HSQ copolymers, organosilanes and any other Si-containing material. In this embodiment of the present invention, porous or non-porous inorganic dielectrics can be used as the top spun-on dielectric. While the pore size of the inorganic spun-on dielectric is not critical to the present invention, the pore size of the inorganic spun-on dielectric employed in the present invention is typically of from about 5 to about 500 Å at a volume percent porosity of from about 5 to about 80%, with a pore size of from about 10 to about 200 Å at a volume percent porosity of from about 10 to about 50% being more preferred.

In this embodiment, it is highly preferred to employ a porous inorganic top spun-on dielectric and a non-porous organic bottom spun-on dielectric.

In another embodiment of the present invention, which is preferred, the bottom spun-on dielectric is an inorganic dielectric (porous or not porous) and the top spun-on dielectric is an organic dielectric material which may, or may not be porous, with the proviso that at least one of the spun-on dielectrics of the hybrid structure is porous. It is noted that the above description concerning the types of organic and inorganic dielectrics used in the first embodiment of the present invention also hold here for this embodiment. Thus, no further description is needed herein. In this embodiment, it is highly preferred to have a porous organic top spun-on dielectric and a porous inorganic bottom spun-on dielectric.

It is noted that prior to spin-coating the top dielectric onto the bottom dielectric, the bottom spun-on dielectric may be treated with a conventional adhesion promoter. The application of the adhesion promoter includes conventional spun-on processes well known to those skilled in the art. A rinse and baking steps may occur after spinning-on the adhesion promoter. The rinsing and baking steps ensure that all residual solvent and non-reactive adhesion promoter are removed from the bottom spun-on dielectric prior to forming the top spun-on dielectric thereon.

Notwithstanding which embodiment is employed in the present invention, the bottom spun-on dielectric layer of the hybrid low-k dielectric has a thickness of from about 500 to about 10,000 Å, with a thickness of from about 900 to about 3000 Å being more preferred. Insofar as the top spun-on dielectric is concerned, that layer typically has a thickness of from about 500 to about 10,000 Å, with a thickness of from about 1000 to about 3000 Å being more preferred. It is noted that although the drawings depict the presence of only two spun-on dielectrics, additional spun on dielectric layers are also contemplated herein.

The hybrid low-k dielectric containing top and bottom spun-on dielectrics may be cured now, or if the hard mask is made from spun-on dielectrics, the hybrid dielectric and hard mask may be cured in a single curing step. The later is preferred since it reduces the number of processing steps in the overall procedure. The curing conditions mentioned hereinbelow also apply to the embodiment wherein curing occurs prior to formation of the hard mask.

Figure 1B:
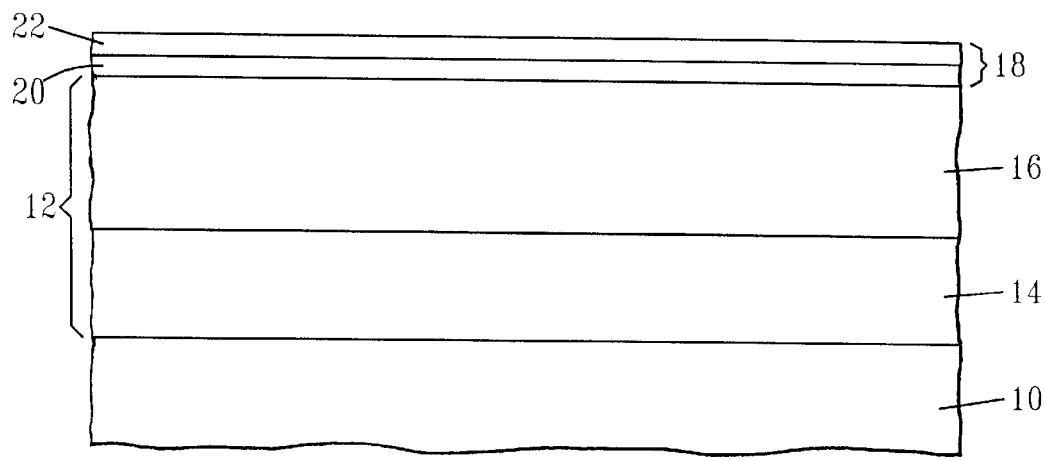

After forming the structure shown in FIG. 1A, hard mask 18 is formed on the uppermost surface of the hybrid dielectric, i.e., on top spun-on dielectric 16. In accordance with the present invention, hard mask 18 includes at least polish stop layer 20 and patterning layer 22. The hard mask, which is shown in FIG. 1B, may be formed by conventional PECVD processes, or more preferably, each layer of hard mask 18 is formed by spin-on coating. Layers formed by spin-on coating are preferred since they reduce the number of deposition tools used in the overall process; therefore reducing the overall manufacturing cost. Moreover, although the drawings depict the presence of two layers in the hard mask, the hard mask may contain more than two layers.

The materials used in forming the hard mask may vary and are dependent upon their etch selectivity towards the layer that lies directly underneath. For example, the patterning layer employed in the present invention is a material that has high-etch selectivity (about 10:1 or greater) towards the underlying polish stop layer. The polish stop layer, on the other hand, is a material that has high-etch selectivity towards the underlying top spun-on dielectric and it should have a dielectric constant that does not significantly increase the effect dielectric constant of the hybrid low-k dielectric. The polish stop layer also has a very negligible polish rate in the CMP process used to polish the metal features during the damascene process.

Accordingly, the patterning layer may include organic or inorganic dielectrics, while the polish stop layer may comprise inorganic or organic dielectrics. The exact nature of each layer will be dependent first upon the top spun-on dielectric of the hybrid low-k dielectric and then upon the polish stop layer. For example, if the top spun-on dielectric is an organic dielectric, then the polish stop layer is typically an inorganic dielectric and the patterning layer is typically formed of an organic dielectric layer. The thickness of each layer of the hard mask may vary and is not critical to the present invention. Typically, however, the patterning layer has a thickness of from about 100 to about 3000 Å, and the polish stop layer has a thickness of from about 100 to about 1000 Å.

Following formation of the hard mask, the hard mask, i.e., polish stop and patterning layers, as well as the underlying multilayer of spun-on dielectrics may be subjected to a single curing step which is carried out using conventional conditions well known to those skilled in the art. The single curing step occurs if all the dielectrics are made from spun-on dielectrics. The curing step may include a hot plate bake step or furnace heating. In the present invention, it is preferred to use a curing step that includes furnace baking. Although the conditions for curing may vary, typically, hot plate baking is carried out at temperature of from about 250° to about 500° C. for a time period of from about 30 to about 500 seconds, while the furnace baking step is carried out at a temperature of from about 200° to about 500° C. for a time period of from about 15 minutes to about 3.0 hours. It is again emphasized that if the hard mask is not composed of spun-on dielectrics, then curing may occur prior to hard mask deposition. Moreover, since a spun-on hard mask is preferred, the drawings and following description are specific for that embodiment. It is noted however that the drawings and following description are valid for hard masks that are not spun-on coated.

Figure 1C:
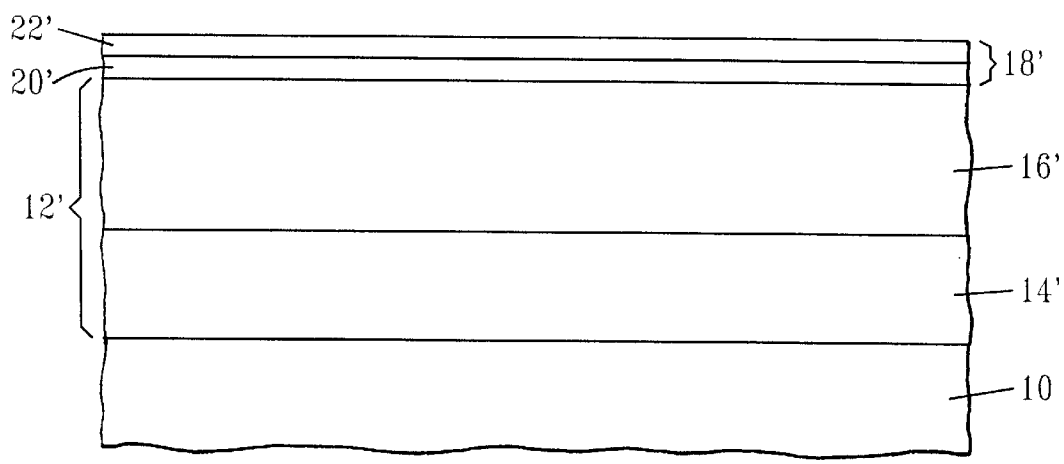
Figure 1D:
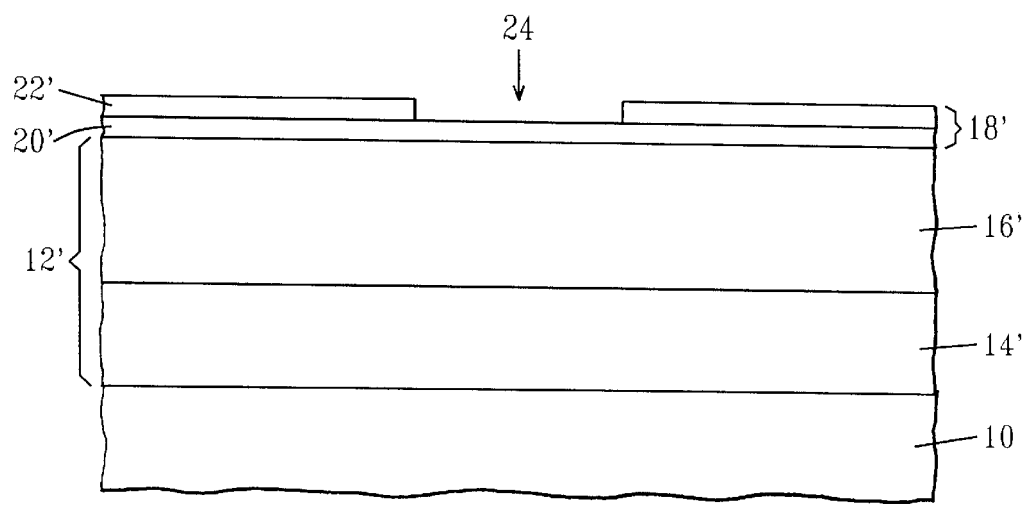

The cured layers are shown in FIG. 1C and are labeled as cured hybrid low-k dielectric 12' including cured top spun-on dielectric 16' and cured bottom spun-on dielectric 14', and cured hard mask 18' including cured polish stop layer 20' and cured patterning layer 22'. Following curing of the hybrid low-k dielectric and optionally the hard mask, the structure shown in FIG. 1C is then subjected to a first lithography and etching process which forms opening 24 in cured patterning layer 22'; See FIG. 1D. Specifically, the structure shown in FIG. 1D is formed as follows: First, a photoresist (not shown in the drawings) used for patterning the patterning layer is formed on the cured patterning layer using conventional deposition processes well known to those skilled in the art. The photoresist is then exposed to a pattern of radiation and thereafter the pattern is developed in the photoresist using conventional resist developers.

After developing the resist pattern, opening 24 is formed in the hard mask so as to expose a portion of the underlying polish stop layer. Specifically, the opening is formed by a conventional dry etching process including, but not limited to: reactive-ion etching (RIE), plasma etching and ion beam etching. Of these various dry etching processes, it is preferred to use RIE that includes fluorine-based chemistries. After this etching step, the patterned photoresist is stripped from the structure utilizing conventional stripping processes well known to those skilled in the art. The resultant structure obtained from the first lithography and etching step is shown in FIG. 1D.

Figure 1E:
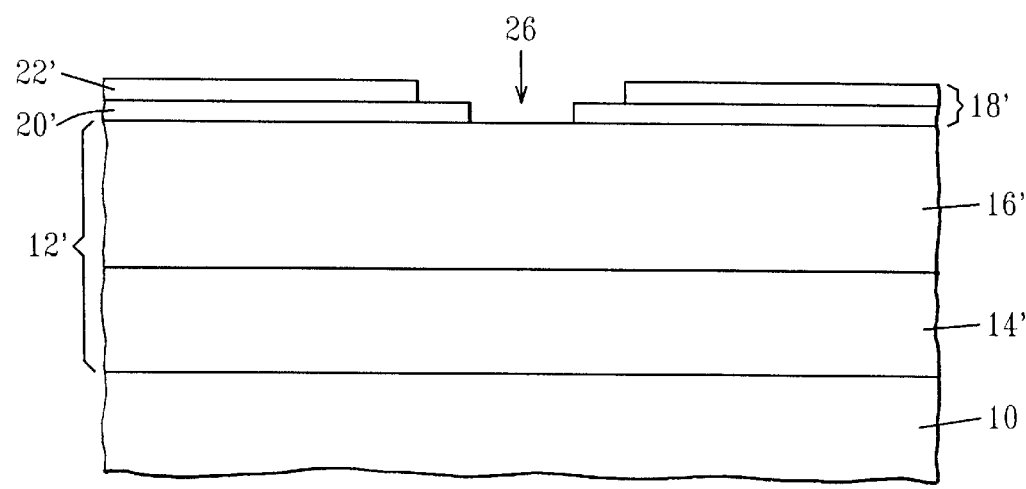

After stripping the photoresist from the structure, a new photoresist (not shown) is applied to the structure shown in FIG. 1D. The new photoresist is then subjected to lithography and etching so as to provide second opening 26 in the structure which exposes a surface of cured hybrid low-k dielectric 12'. The second etching step includes one of the aforementioned dry etching processes. Of these various dry etching processes, it is preferred to use RIE that includes fluorine-based chemistries. Following the second etch which exposes the cured multilayer of spun-on dielectrics, the second photoresist can be stripped from the structure utilizing a conventional stripping process providing a structure such as shown in FIG. 1E.

In a preferred embodiment, the second resist is consumed during the etch of the porous organic top dielectric, thereby eliminating exposure of the bottom inorganic porous dielectric to potentially harmful resist strip plasmas.

Figure 1F:
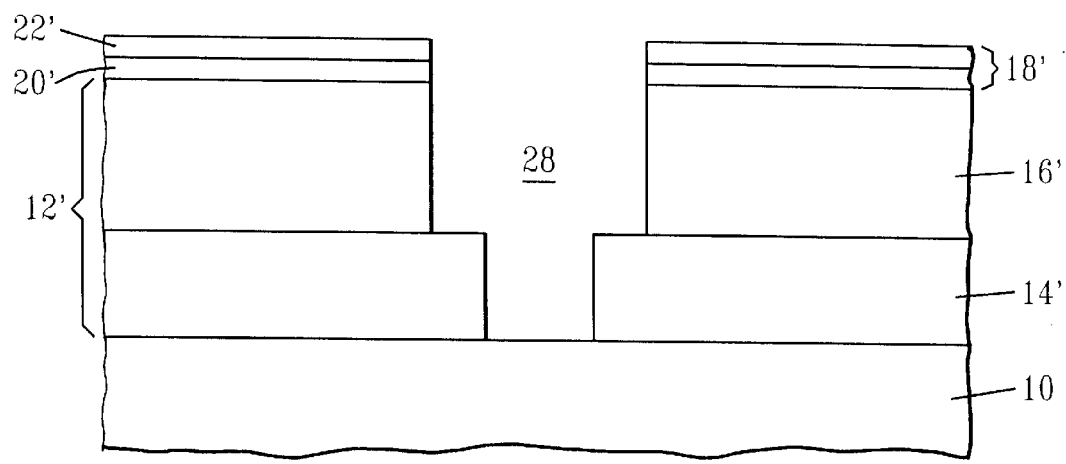

FIG. 1F shows the structure after the pattern formed in the hard mask is transferred to the hybrid low-k dielectric. Specifically, the pattern transfer, which forms trench 28 in the hybrid dielectric, is carried out using a dry etching process that includes oxygen or reducing chemistry. In accordance with the present invention, trench 28 may be a via or line or both.

Figure 1G:
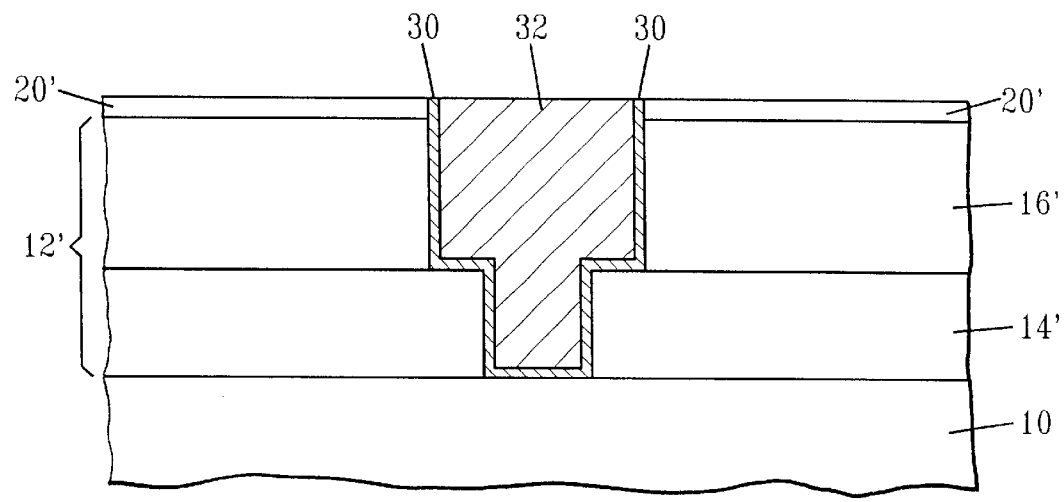

Following the pattern transfer to the hybrid dielectric, the trench is then filled with a conductive metal 32 and planarized so as to provide the structure shown in FIG. 1G. An optional, but preferable liner material 30 may be formed in the trench prior to filling with the conductive metal. The term "conductive metal" is used herein to denote a metal selected from the group consisting of aluminum (Al), copper (Cu), tungsten (W), silver (Ag) and other like metals which are typically used in interconnect structures. Alloys of these conductive metals such as Al-Cu are also contemplated herein. A preferred metal used in the present invention is copper. The metal is formed in the trench utilizing a conventional deposition process such as chemical vapor deposition (CVD), plasma-assisted CVD, plating, sputtering, chemical solution deposition and other like deposition processes.

The optional liner material employed in the present invention includes any material which would prevent the diffusion of the conductive metal into the dielectric layers. Some examples of such liners include, but are not limited to: TiN, TaN, Ti, Ta, W, WN, Cr, Nb and other like materials and combinations thereof. The liner material may be formed in the trench utilizing conventional deposition processes well known to those skilled in the art, including: CVD, plasma-assisted CVD, sputtering, plating and chemical solution deposition.

After filling the trench with a conductive metal, the structure is subjected to a conventional planarization process such as chemical-mechanical polishing (CMP) which removes any conductive metal above the polish stop layer. Note that the planarization step also removes the patterning layer of the hard mask, but not the polish stop layer from the structure. Instead, the polish stop layer remains on the surface of the structure. Because of this reason, it is essential to choose a polish stop layer that has a dielectric constant that is relatively-low so as to not increase the effective dielectric constant of the interconnect structure.

Following the processing steps of the present invention additional via and wiring levels may be formed over the structure shown in FIG. 1F by repeating the processing steps of the present invention. Thus, the inventive method can be used to prepare interconnect structures that include one or more wiring and via levels present therein.

In summary, the inventive interconnect structure of the present invention has the following advantages over prior art interconnect structures:

The inventive structure (i.e., low-k dielectric plus metal conductor interconnect structure) has precise and uniform control over metal conductor resistance.

The highly controlled metal conductor resistance is obtained without added processing cost, and with a reduction in the use of vacuum-based deposition tools.

The structure of the present invention is stable during thermal cycling (resistance of the vias does not change significantly) due to low-CTE of the porous inorganic dielectric surrounding the vias in one preferred embodiment.

The structure of the present invention withstands conventional CMP processes due to the presence of the tougher organic porous dielectric surrounding the metal lines in another preferred embodiment.

Moreover, the method of the present invention in one preferred embodiment eliminates harmful resist strip plasma exposures to both sets of dielectrics, particularly the bottom porous inorganic dielectric.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An interconnect structure comprising:

a substrate comprising a dielectric, a metal region, an adhesion promoter, a semiconductor wafer or any combination thereof having a patterned hybrid low-k dielectric located directly atop a surface thereof, said patterned hybrid low-k dielectric having an effective dielectric constant of about 2.6 or less and comprising a bottom spun-on dielectric and a top spun-on dielectric which are not separated from each other by a buried layer, wherein said bottom and top spun-on dielectrics have different atomic compositions and at least one of said spun-on dielectrics is porous, and said bottom spun-on dielectric serves as an inherent etch stop layer for said top spun-on dielectric;

a polish stop layer located atop said patterned hybrid low-k dielectric; and metal conductor regions formed within said patterned hybrid low-k dielectric.

2. The interconnect structure of claim 1 wherein said effective dielectric constant of said hybrid low-k dielectric is from about 1.2 to about 2.2.

3. The interconnect structure of claim 1 wherein both of said spun-on dielectrics are porous dielectric materials.

4. The interconnect structure of claim 1 wherein said top spun-on dielectric is an inorganic dielectric and said bottom spun-on dielectric is an organic dielectric.

5. The interconnect structure of claim 4 wherein said top inorganic dielectric is porous.

6. The interconnect structure of claim 5 wherein said top inorganic dielectric has a pore size of from about 5 to about 500 Å at a volume percent porosity of from about 5 to about 80%.

7. The interconnect structure of claim 4 wherein said inorganic dielectric comprises Si, O, and H, and optionally C.

8. The interconnect structure of claim 7 wherein said inorganic dielectric is HOSP, MSQ, TEOS, HSQ, MSQ-HSQ copolymers, organosilanes or any other Si-containing material.

9. The interconnect structure of claim 4 wherein said organic dielectric comprises C, O, and H.

10. The interconnect structure of claim 9 wherein said organic dielectric is an aromatic thermosetting polymeric resin.

11. The interconnect structure of claim 1 wherein said top spun-on dielectric is an organic dielectric and said bottom spun-on dielectric is an inorganic dielectric.

12. The interconnect structure of claim 11 wherein said top organic dielectric is porous.

13. The interconnect structure of claim 12 wherein said top organic dielectric has a pore size of from about 1 to about 50 nm at a volume percent porosity of from about 5 to about 35%.

14. The interconnect structure of claim 11 wherein said organic dielectric comprises C, O, and H.

15. The interconnect structure of claim 14 wherein said organic dielectric is an aromatic thermosetting polymeric resist.

16. The interconnect structure of claim 11 wherein said inorganic dielectric comprises Si, O, and H, and optionally C.

17. The interconnect structure of claim 16 wherein said inorganic dielectric is HOSP, MSQ, TEOS, HSQ, MSQ-HSQ copolymers, organosilanes or any other Si-containing material.

18. The interconnect structure of claim 1 wherein an adhesion promoter is formed between said bottom spun-on dielectric and said top spun-on dielectric.

19. The interconnect structure of claim 1 wherein said polish stop layer is an inorganic dielectric.

20. The interconnect structure of claim 1 wherein said polish stop layer is an organic dielectric.

21. The interconnect structure of claim 1 wherein said metal conductor regions include at least a conductive metal selected from the group consisting of Al, Cu, Ag, W, and alloys thereof.

22. The interconnect structure of claim 21 wherein said conductive metal is Cu.

23. The interconnect structure of claim 1 wherein said metal conductor regions further include a liner material.

24. The interconnect structure of claim 23 wherein said liner material is selected from the group consisting of TiN, TaN, Ta, Ti, W, WN, Cr, Nb and mixtures thereof.

25. A hybrid low-k dielectric useful in fabricating interconnect structures comprising a bottom spun-on dielectric and a top spun-on dielectric which are not separated from each other by a buried layer, wherein said bottom and top spun-on dielectrics have dielectric constants of about 2.6 or less, different atomic compositions and at least one of said dielectrics is porous, and said bottom spun-on dielectric serves as an inherent etch stop layer for said top spun-on dielectric.

* * * * *